US011212921B2

(12) United States Patent
Cui et al.

(10) Patent No.: US 11,212,921 B2
(45) Date of Patent: Dec. 28, 2021

(54) METHOD FOR REPAIRING A FINE LINE

(71) Applicant: Guangdong University of Technology, Guangdong (CN)

(72) Inventors: Chengqiang Cui, Guangdong (CN); Guannan Yang, Guangdong (CN); Guangdong Xu, Guangdong (CN); Yu Zhang, Guangdong (CN); Xin Chen, Guangdong (CN)

(73) Assignee: Guangdong University of Technology, Guangzhou (CN)

( * ) Notice: Subject to any disclaimer, the term of this patent is extended or adjusted under 35 U.S.C. 154(b) by 0 days.

(21) Appl. No.: 17/110,501

(22) Filed: Dec. 3, 2020

(65) Prior Publication Data

US 2021/0176865 A1  Jun. 10, 2021

(30) Foreign Application Priority Data

Dec. 4, 2019 (CN) .......................... 201911229215.X

(51) Int. Cl.
*H05K 3/22* (2006.01)
*H05K 3/26* (2006.01)
*H05K 1/09* (2006.01)
*H05K 3/28* (2006.01)

(52) U.S. Cl.
CPC ............. *H05K 3/225* (2013.01); *H05K 1/097* (2013.01); *H05K 3/26* (2013.01); *H05K 3/288* (2013.01); *H05K 1/09* (2013.01); *H05K 2203/013* (2013.01); *H05K 2203/0104* (2013.01); *H05K 2203/0126* (2013.01); *H05K 2203/025* (2013.01); *H05K 2203/107* (2013.01); *Y10T 29/49165* (2015.01)

(58) Field of Classification Search
CPC .......... H05K 3/225; H05K 3/25; H05K 3/288; H05K 2203/025; H05K 2203/107; H05K 1/09; H05K 1/097; H05K 2003/0104; H05K 2003/0126; H05K 2003/013; H05K 3/26; Y10T 29/49165
See application file for complete search history.

(56) References Cited

U.S. PATENT DOCUMENTS

| 4,694,138 | A | * | 9/1987 | Oodaira | ........... H05K 2203/107 156/379.6 |
|---|---|---|---|---|---|
| 2011/0278269 | A1 | * | 11/2011 | Gold | ...................... H05K 3/225 219/121.69 |
| 2015/0156886 | A1 | * | 6/2015 | Wang | ...................... H05K 1/09 174/253 |
| 2015/0201500 | A1 | * | 7/2015 | Shinar | .............. H05K 2003/013 425/132 |

FOREIGN PATENT DOCUMENTS

| CN | 108848620 A | 11/2018 |
|---|---|---|
| CN | 109192700 A | 1/2019 |
| CN | 109733084 A | 5/2019 |
| CN | 110205588 A | 9/2019 |
| JP | 2011249357 A | * 12/2011 |

* cited by examiner

*Primary Examiner* — A. Dexter Tugbang

(57) ABSTRACT

A method for repairing a fine line is provided. Nano metal particles are filled in a defect of a circuit board. The nano metal particles in the defect are irradiated by a laser, or heated, such that the nano metal particles in the defect are metallurgically bonded to an original line of the circuit board. A surface of the circuit board is cleaned to remove residual nano metal particles on parts of the circuit board where metallurgical bonding is not performed, thereby completing line repairing of the circuit board.

9 Claims, 6 Drawing Sheets

METHOD FOR REPAIRING A FINE LINE

CROSS-REFERENCE TO RELATED APPLICATIONS

This application claims the benefit of priority from Chinese Patent Application No. 201911229215.X, filed on Dec. 4, 2019. The content of the aforementioned application, including any intervening amendments thereto, is incorporated herein by reference in its entirety.

TECHNICAL FIELD

The present application relates to integrated circuits, and more particularly to a method for repairing a fine line.

BACKGROUND

A printed circuit board mechanically supports and electrically connects electrical or electronic components. The printed circuit board in the same type adopted in electronic equipment has consistency, which can reduce the error of manual wiring, and realize the automatic insertion or mounting, automatic soldering and automatic inspection of electronic components, thereby ensuring the quality of the electronic equipment, improving labor productivity, reducing costs and facilitating the maintenance. With miniaturization and digitalization of electronic products, the printed circuit board has the development tread of high density, high precision, fine aperture, fine wires, fine pitch, high reliability, being multilayer, high-speed transmission, light weight and being thin, so higher dements are required for the preparation and repair of fine lines.

Defects of the fine lines can be repaired by a method based on a bonding machine, specifically, bonding wires are transferred to a defective line and then irradiated with a laser to complete the repairing of the defective line. However, the bonding wires are relatively soft and thus readily deformed during the transference of the bonding wires or under the laser irradiation, which causes difficulties in the operation of repairing the defective line.

SUMMARY

In order to solve the problems mentioned above, the present application provides a method for repairing a fine line.

The technical solutions of the present application are described below.

A method for repairing a fine line, comprising:
1) filling nano metal particles in a defect of a circuit board;
2) irradiating, by a laser, or heating, the nano metal particles in the defect, such that the nano metal particles in the defect are metallurgically bonded to an original line of the circuit board; and
3) cleaning a surface of the circuit board to remove residual nano metal particles on parts of the circuit board where metallurgical bonding is not performed, thereby completing line repairing of the circuit board.

In step 1), after the nano metal particles are filled in the defect, a light-transmitting plate covers the defect, and a downward force is applied to the light-transmitting plate; and in step 2), during the irradiation by the laser, the laser is focused on the nano metal particles under the light-transmitting plate.

In an embodiment, in step 3), the step of cleaning the surface of the circuit board comprises:
cleaning the surface of the circuit board using an organic solution; heating the circuit board according to the degree of removal of the residual nano metal particles; or
cleaning the surface of the circuit board using an oxidizing solution to oxidize the residual nano metal particles on the surface of the circuit board; and cleaning the surface of the circuit board using an acid solution to remove the residual nano metal particles on the surface of the circuit board.

In an embodiment, the nano metal particles are sent to the defect by inert gas; or
a liquid or a paste prepared by adding the nano metal particles into a solvent is sent to the defect by a spray nozzle or a drip nozzle.

In an embodiment, the solvent comprises one or more of ethylene glycol, ethanol and terpineol; the solvent is 0-80% by weight of the paste; and during the preparation of the liquid or the paste, an organic reducing agent comprising aldehydes or alcohols and a soldering flux comprising rosin are added.

In an embodiment, in step 2), an arc-shaped protrusion is provided at an upper surface of the light-transmitting plate; when the nano metal particles are irradiated using the laser, the laser is focused on the nano metal particles under the light-transmitting plate through the arc-shaped protrusion.

In an embodiment, a surface of the nano metal particles is coated with one or more of polyvinylpyrrolidone, imidazole, 2-phenylimidazole and benzimidazole.

In an embodiment, the nano metal particles are a mixture of particles with the same particle size; or
the nano metal particles are a mixture of nano-sized particles with different particle sizes; or
the nano metal particles are a mixture of nano-sized particles and micron-sized particles.

In an embodiment, the nano metal particles are a mixture of particles with the same particle size ranging from 1 nm to 5000 nm; and the nano metal particles have the same shape, being spherical, linear, flake-shaped or irregularly-shaped; or
the nano metal particles are a mixture of particles having different shapes and different particle sizes.

In an embodiment, the nano metal particles comprise one or more of nano copper particles, nano silver particles, nano silver-coated copper particles, nano silver-coated copper flakes and nano copper-silver alloy particles.

In an embodiment, when the nano metal particles are irradiated by the laser in step 2), the laser is a continuous laser or a pulsed laser with a wavelength of 0.01 μm-20 μm; a pulse width of the pulsed laser is in the order of picoseconds, femtoseconds or nanoseconds; and the laser is a single pulse-type laser or a multiple pulse-type laser.

In an embodiment, in step 2), when the laser irradiates the liquid or paste prepared by adding the nano metal particles into the solvent, the liquid or paste is irradiated by the laser; or
the liquid or paste in the defect is preheated and dried using a laser with first energy lower than preset energy, so as to reduce an organic content in the liquid or paste; and then the liquid or paste is irradiated by a laser with second energy higher than the preset energy, so that the liquid or paste in the defect is metallurgically bonded to the original line.

BRIEF DESCRIPTION OF THE DRAWINGS

The present application will be further described below with reference to the accompanying drawings. However, these disclosures are not intended to limit the present application.

Figure 1:
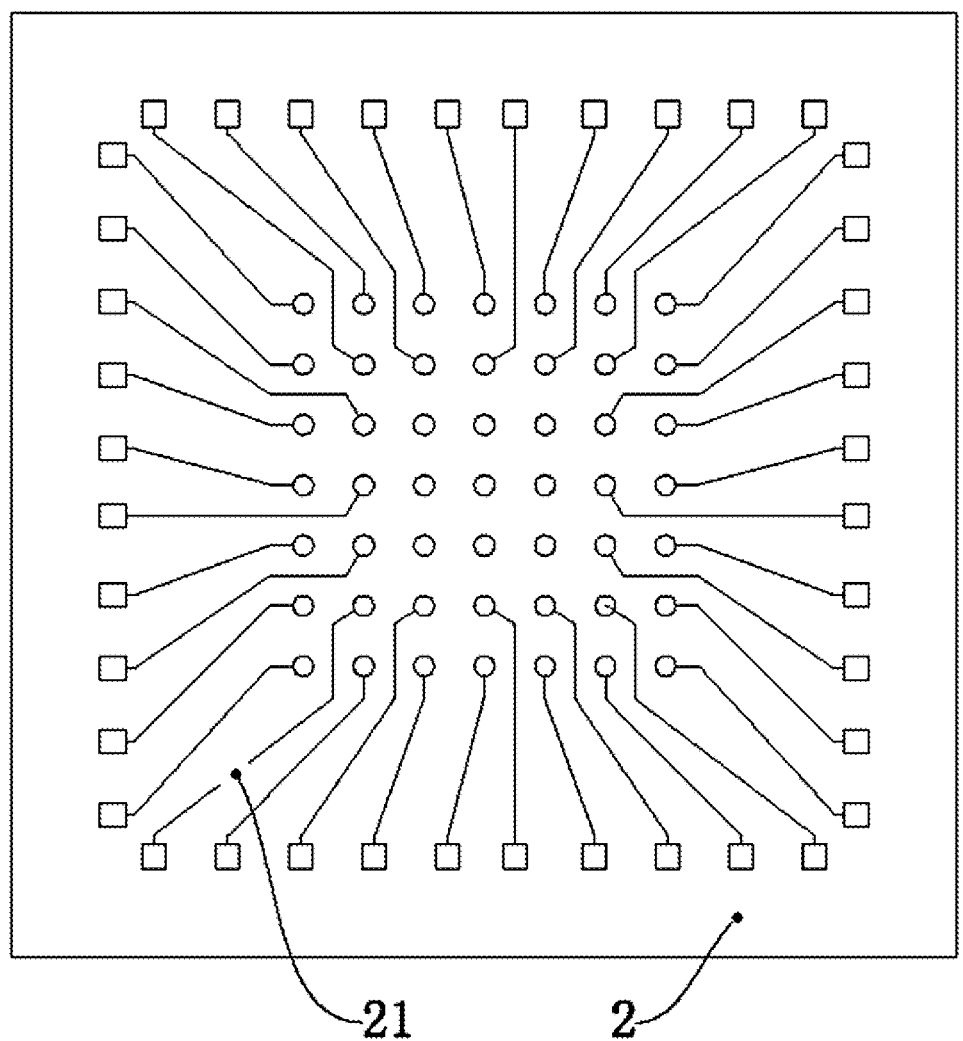
FIG. 1 is a top view of a circuit board before being repaired according to an embodiment of the present application.

In the drawings: 1, nano metal particles; 2, circuit board; and 3, laser.

DETAILED DESCRIPTION OF EMBODIMENTS

The technical solutions of the present application will be further described below in conjunction with the accompanying drawings and the embodiments.

Figure 2:
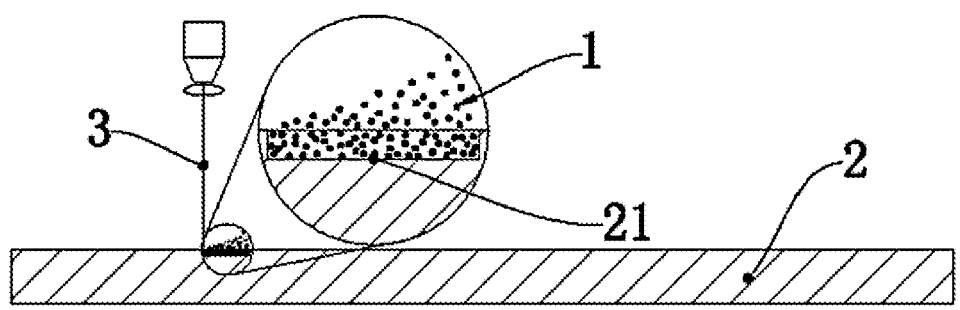
FIG. 2 is a front view of the circuit board before being repaired according to an embodiment of the present application.
Figure 3:
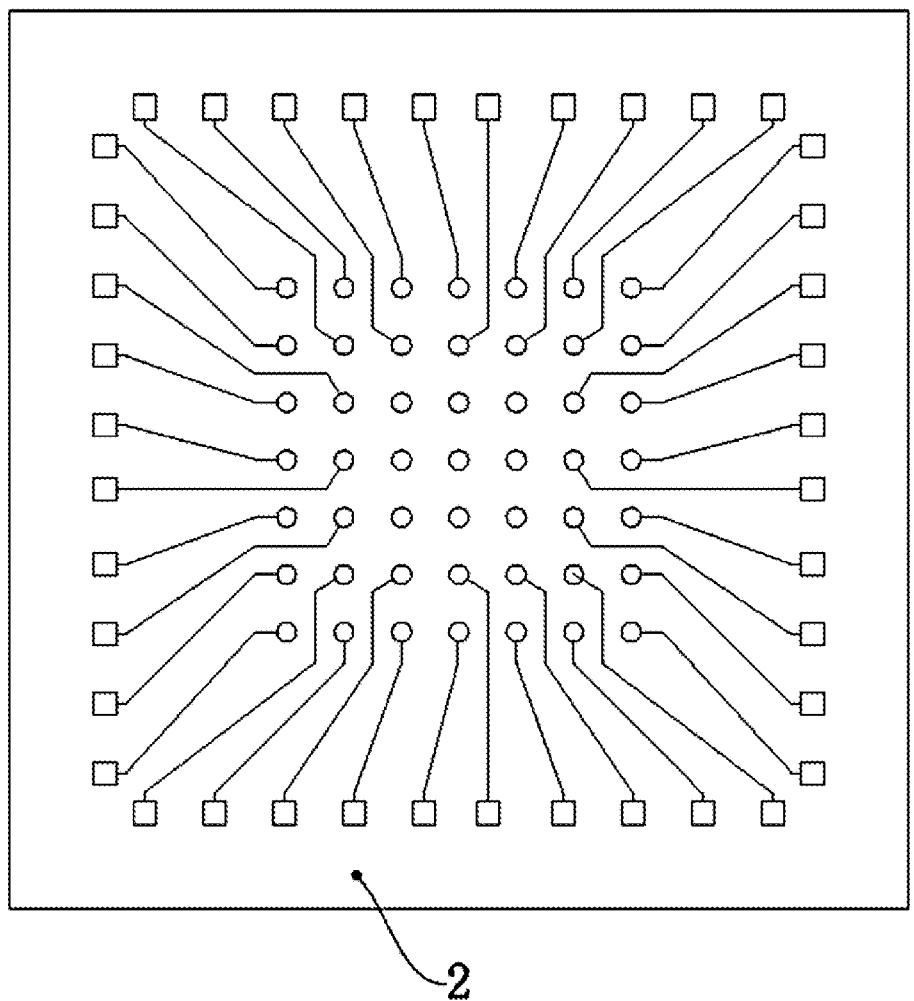
FIG. 3 is a top view of the circuit board being repaired according to an embodiment of the present application.
Figure 4:
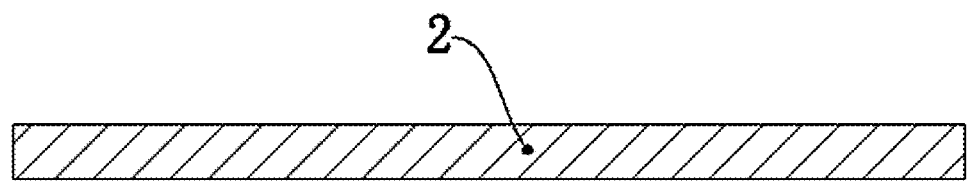
FIG. 4 is a front view of the circuit board being repaired according to an embodiment of the present application.
Figure 5:
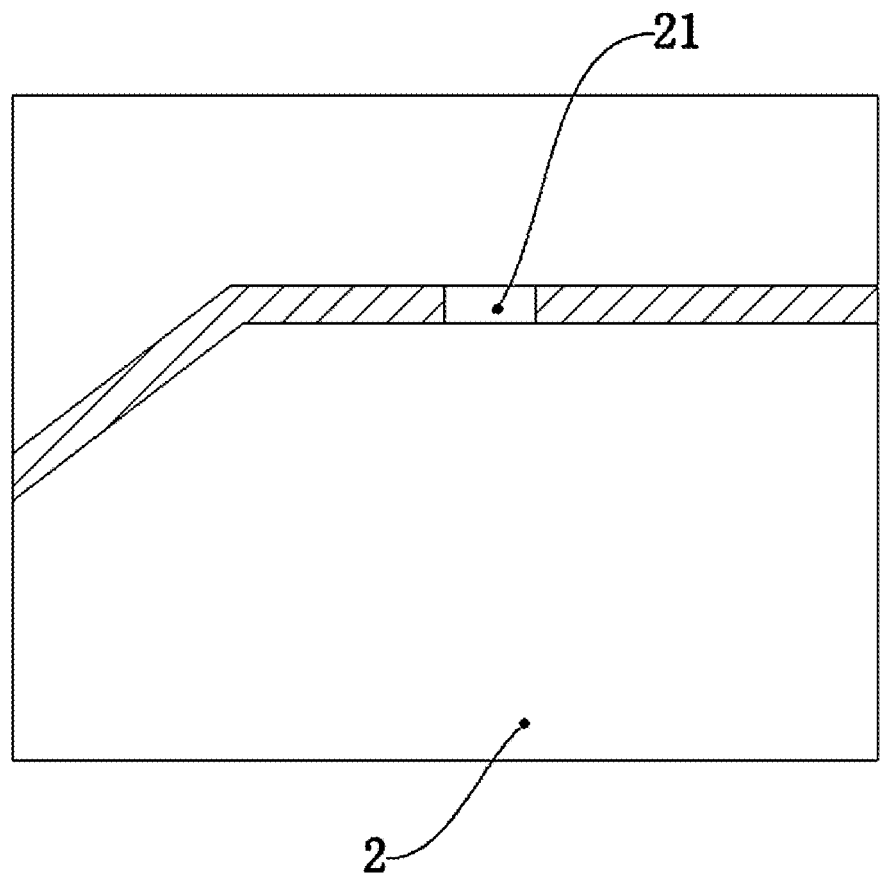
FIG. 5 is a top view of the circuit board before being repaired according to an embodiment of the present application.
Figure 6:
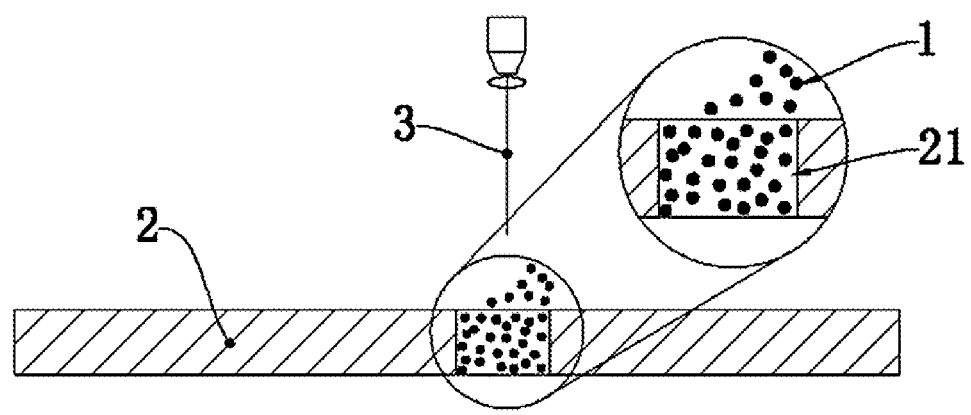
FIG. 6 is a front view of the circuit board before being repaired according to an embodiment of the present application.
Figure 7:
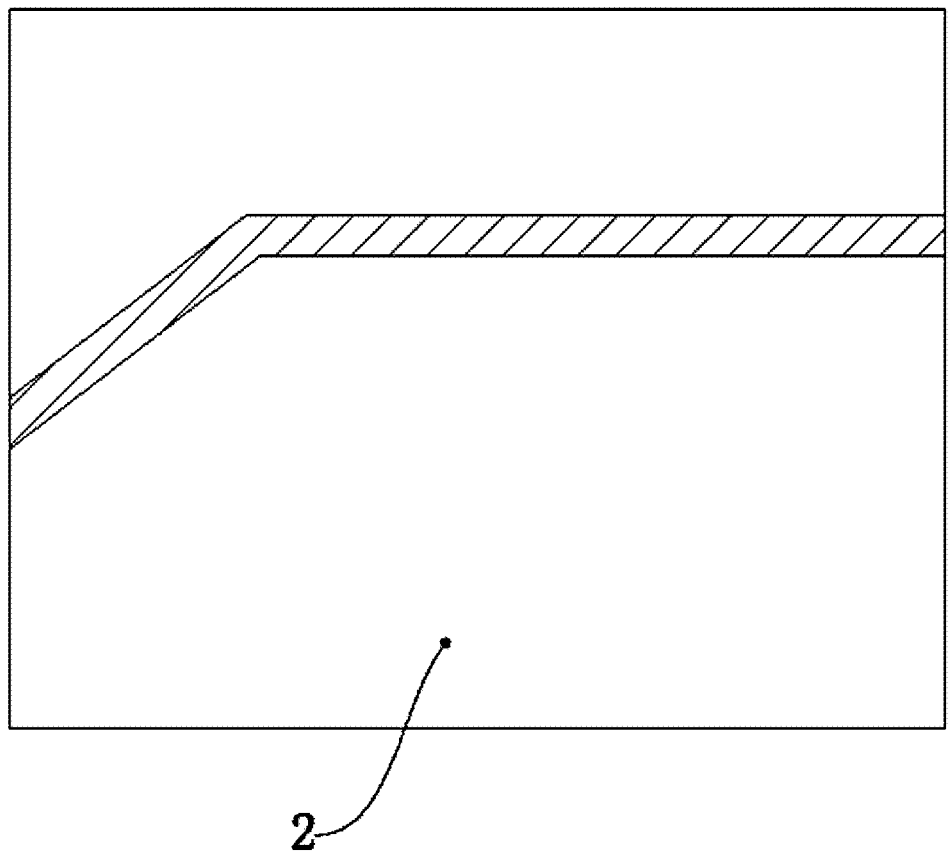
FIG. 7 is a top view of the circuit board being repaired according to an embodiment of the present application.
Figure 8:
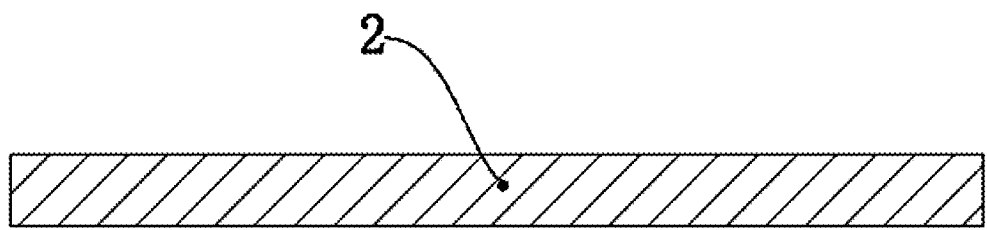
FIG. 8 is a front view of the circuit board being repaired according to an embodiment of the present application.
Figure 9:
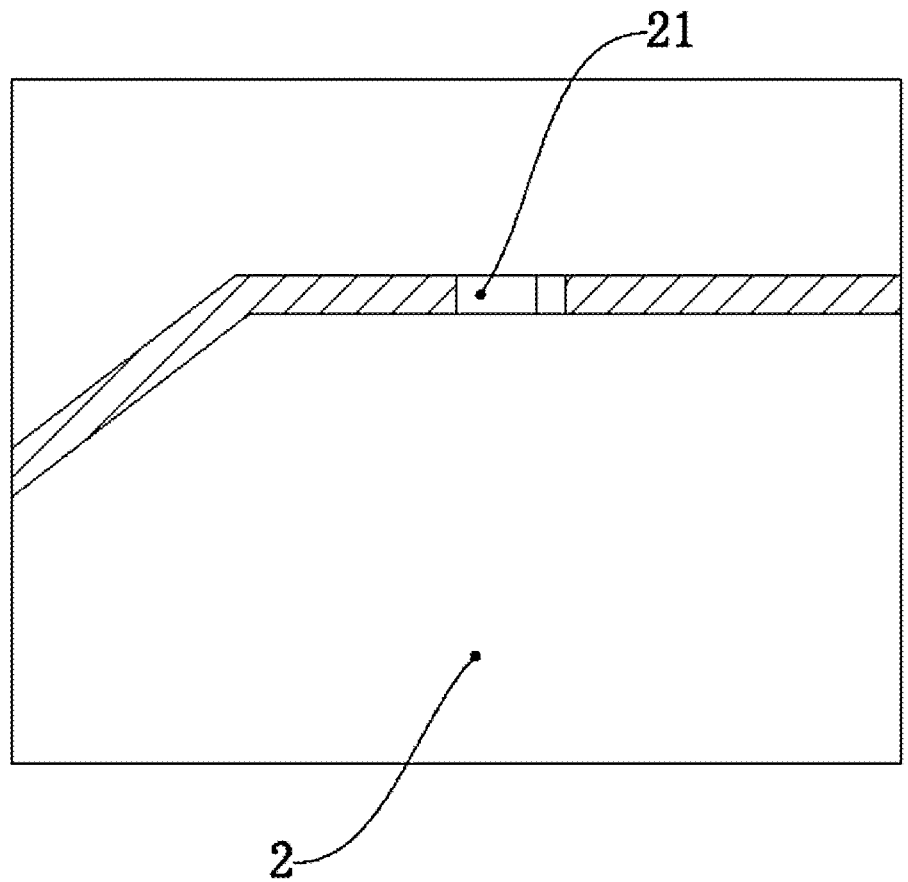
FIG. 9 schematically shows a repair process according to an embodiment of the present application.
Figure 10:
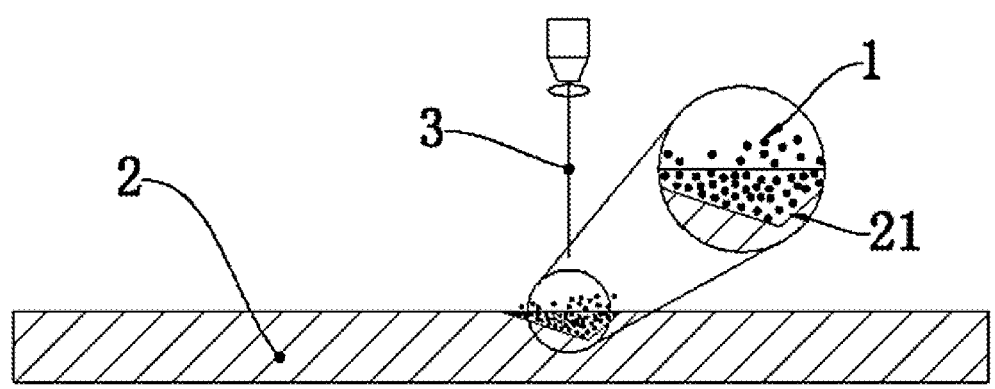
FIG. 10 is a front view of the circuit board before being repaired according to an embodiment of the present application.
Figure 11:
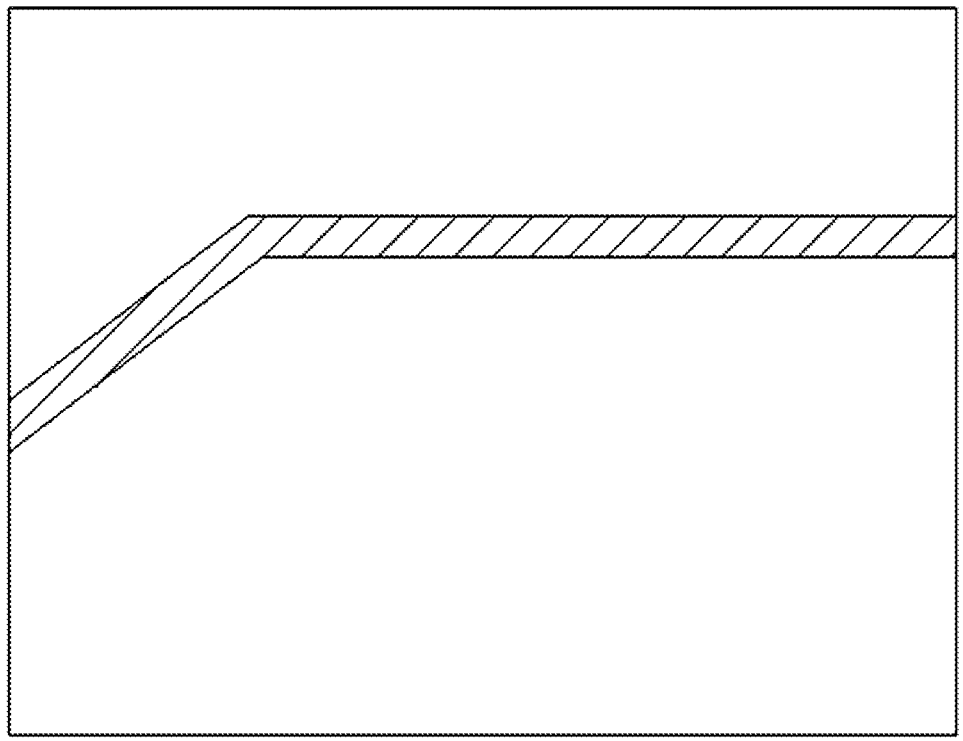
FIG. 11 is a top view of the circuit board being repaired according to an embodiment of the present application.
Figure 12:
FIG. 12 is a front view of the circuit board being repaired according to an embodiment of the present application.

A method for repairing a fine line in this embodiment, as shown in FIGS. 1-12, includes the following steps.

Step A) Nano metal particles 1 are filled in a defect 21 of a circuit board 2.

Step B) The nano metal particles 1 in the defect 21 are irradiated using a laser 3 or directly heated, such that the nano metal particles 1 in the defect 21 are metallurgically bonded to an original line of the circuit board 2. Specifically, the original line of the circuit board 2 refers to lines of the circuit board 2 without defects.

Step C) A surface of the circuit board 2 is cleaned to remove residual nano metal particles on parts of the circuit board 2 where metallurgical bonding is not performed, thereby completing line repairing of the circuit board 2.

In the present application, the lines of the circuit board 2 are fine fines.

The method for repairing the fine line of the present application can be used for repairing defects such as open-circuit faults, hollows and gaps, of lines and redistribution layers in various carriers such as printed circuit boards (PCB), flexible printed circuit boards (FPC) and dielectric materials. The defect 21 has a recess in which the nano metal particles 1 may be filled. After the recess is filled with the nano metal particles 1, the nano metal particles 1 are irradiated by a laser 3 or directly heated. As the temperature rises, the nano metal particles 1 will be melted and metallurgically bonded with the original line of the circuit board 2. It is known that the melting temperature of a solid sharply decreases when a large-sized solid becomes nanoscale. Therefore, during sintering, the nano metal particles 1 can be melted at a lower temperature and be metallurgically bonded to the original line of the circuit board 2 to realize the line repairing of the circuit board 2. Because metallurgical bonding between the nano metal particles 1 and the original line of the circuit board 2 is performed at a temperature much lower than the melting point of a large-sized metal, the line repairing of the circuit board 2 is realized at a lower temperature by filling the nano metal particles 1 in the defect 21 so that the lines of the circuit board 2 form a complete conductive path. When the nano metal particles 1 are filled in the defect 21, some of the nano metal particles 1 are scattered to other parts on the surface of the circuit board 2, or when the nano metal particles 1 in the defect 21 are irradiated using the laser 3 or directly heated, some of the nano metal particles 1 jump from the defect 21 to other parts on the surface of the circuit board 2 due to impact. Therefore, the surface of the circuit board 2 needs to be cleaned to remove the residual nano metal particles on parts of the circuit board 2 where metallurgical bonding is not performed, thereby completing the line repairing of the circuit board 2. However, in the traditional repair process, a bonding machine is required for repairing a defective line on the circuit board 2, specifically, bonding wires are transferred by the bonding machine to the defect of the circuit board 2, and then are irradiated using the laser 3 to melt the bonding wires to cover the defective line of the circuit board 2, thereby completing the line repairing of the circuit board 2. The use of the bonding machine which is dedicated increases the cost of the line repairing of the circuit board 2. In addition, the bonding wires are very soft and thus readily deformed during the transference of the bonding wires or under the laser irradiation. Therefore, even with the corresponding repair equipment, there are difficulties to perform the repairing, so it is difficult to repair the defective line of the circuit board 2. In the repair process of the present application, the nano metal particles 1 are filled in the defect and then irradiated using the laser 3 or directly heated to melt with the increase of the temperature, and the melted nano metal particles 1 are metallurgically bonded with the original line of the circuit board 2, so as to fill defects of the original line of the circuit board 2. Due to the extremely small particle size of the nano metal particles 1, it is extremely simple to place the nano metal particles 1 to the circuit defect position 21. Compared to the method of transferring the bonding wires to the defect 21, the operation of filling the nano metal particles 1 in the defect 21 is less difficult, so that the line repairing becomes simpler and easier, thereby effectively lowering the requirements for the line repairing. In addition, the method for repairing the fine line of the present application does not require special equipment, which effectively reduces the cost of repairing the fine line for manufacturers and thus brings huge economic benefits to the society.

Compared to the prior art, the method of the present application involves simpler process steps and is less difficult. By filling the nano metal particles 1 in the defect 21, there is no need to consider that the existing bonding wires are hard to be operated and easy to deform. The method of the present application is less difficult and has extremely high social benefits.

In step C), the step of cleaning the surface of the circuit board 2 includes steps as follows. The surface of the circuit board 2 is cleaned using an organic solution. Then the circuit board 2 is appropriately heated according to the degree of removal of the residual nano metal particles on the parts of the circuit board 2 where metallurgical bonding is not performed. Or, the surface of the circuit board 2 is cleaned using an oxidizing solution to oxidize the residual nano metal particles. Then the surface of the circuit board 2 is cleaned using an acid solution to remove the residual nano metal particles.

The circuit board 2 is heated, and the residual nano metal particles will easily fall off the surface of the circuit board 2 in the organic solution because the residual nano metal particles are not metallurgically bonded with the original line of the circuit board 2. In order to prevent the organic solution from polluting parts of the circuit board 2 where metallurgical bonding is performed, an easily volatile organic solvent is used to clean the surface of the circuit board 2, so as to remove the residual nano metal particles on the parts of the circuit board 2 where metallurgical bonding is not performed, while the nano metal particles 1 that have been metallurgically bonded with the original line of the circuit board 2 will not be removed from the surface of the circuit board 2. When the organic solution is used to clean the surface of the circuit board 2, the circuit board 2 can be properly heated according to the degree of removal of the residual nano metal particles, and ultrasonic treatment can be used to accelerate the removal of the residual nano metal particles from the surface of the circuit board 2.

The surface of the circuit board 2 is cleaned using an oxidizing solution to oxidize the residual nano metal particles on the circuit board 2 followed by the use of an acid solution for reaction to complete the removal of the residual nano metal particles from the circuit board 2.

The nano metal particles 1 are sent to the defect 21 by inert gas. Or a liquid or a paste prepared by adding the nano metal particles into a solvent is sent to the defect 21 by a spray nozzle or a drip nozzle.

Due to a large specific surface area of the nano metal particles 1, the surface of the nano metal particles 1 is easily oxidized when exposed to the air. Thus, the inert gas is adopted in the present application to transfer the nano metal particles 1 for the protection purpose, i.e., the surface of the nano metal particles 1 is protected from oxidation. Of course, by adding the nano metal particles 1 into the solvent to prepare a liquid or paste, the nano metal particles 1 can also be isolated from the air. By the adjustment of the viscosity and surface tension of the liquid or paste, the liquid or paste that contains the nano metal particles 1 can be poured into and adsorbed in the defect 21.

The solvent is one or more of ethylene glycol, ethanol, terpineol and other organic alcohols. The solvent is 0-80% by weight of the paste. During the preparation of the liquid or the paste, aldehydes, alcohols or other organic reducing agents and rosin or other soldering fluxes are added.

The use of ethylene glycol, ethanol, terpineol and other organic alcohols enables the nano metal particles 1 to be isolated from the air, at the same time, the ethylene glycol, ethanol, terpineol and other organic alcohols do not react with the nano metal particles 1, so the surface of the nano metal particles 1 will not be oxidized. In addition, the addition of the rosin or other soldering fluxes realizes better metallurgical bonding between the nano metal particles 1 that are melted and the original line of the circuit board 2, thereby obtaining a better effect in the line repairing.

In step A), after the nano metal particles 1 are filled in the defect 21, a light-transmitting plate covers the defect, and a downward force is applied to the light-transmitting plate.

In step B), when the nano metal particles 1 are irradiated using the laser 3, the laser 3 is focused on the nano metal particles 1 under the light-transmitting plate. An arc-shaped protrusion is provided at an upper surface of the light-transmitting plate. Through the arc-shaped protrusion, the laser can be better focused on the nano metal particles 1 under the light-transmitting plate. Whereby, the metallurgical bonding strength and conductivity become better after the nano metal particles 1 are metallurgically bonded to the original line of the circuit board 2.

The light-transmitting plate may be made of ordinary glass or quartz glass which has high transmittance for the laser 3 to pass through, so as to reduce the loss of the laser 3 when it passes through the light-transmitting plate.

The nano metal particles 1 are provided with a surface coating. The surface coating includes one or more of polyvinylpyrrolidone, imidazole, 2-phenylimidazole and benzimidazole.

Polyvinylpyrrolidone, imidazole, 2-phenylimidazole and benzimidazole are easily volatilized or decomposed under the irradiation of the laser 3, so the surface coating can protect the nano metal particles 1 from the surface oxidation before the laser 3 irradiates the nano metal particles 1. When the laser 3 irradiates the nano metal particles 1, the surface coating will volatilize or decompose under the irradiation of the laser 3, so the nano metal particles 1 are exposed and melted to be metallurgically bonded with the original line of the circuit board 2, thereby completing the line repairing of the circuit board 2, at the same time, the surface coating will not remain in the defect 21, obtaining better effect in the line repairing.

The nano metal particles 1 are a mixture of particles with the same particle size. Or, the nano metal particles 1 are a mixture of nano-sized particles with different particle sizes. Or, the nano metal particles 1 are a mixture of nano-sized particles and micron-sized particles.

An area of the defect 21 varies in different circuit boards 2. Nano-sized metal particles are costly, and the smaller the particle size of the nano-sized metal particles, the higher the price. For lines with smaller defects, fewer nano metal particles 1 are required to fill the defect 21, at this time, the nano metal particles 1 with the same particle size or different particle sizes can be used. For lines with larger defects, more nano metal particles 1 are required to fill the defect 21, at this time, the nano metal particles can be a mixture of nano-sized particles and micron-sized particles, so as to reduce the consumption of the nano-sized metal particles, thereby reducing the cost of the line repairing under the premise of ensuring the same effect of the line repairing.

The nano metal particles 1 have a particle size of 1 nm-5000 nm, and the nano metal particles 1 are spherical, linear, flake-shaped or irregularly-shaped. Or, the nano metal particles 1 are a mixture of particles having different shapes and different particle sizes.

When the nano metal particles 1 are not nano silver particles, the nano metal particles 1 can be covered by a layer of silver to form nano silver-coated metal particles. The nano metal particles 1 include one or more of nano copper particles, nano silver particles, nano silver-coated copper particles, nano silver-coated copper flakes and nano copper-silver alloy particles.

Silver has extremely high chemical stability and electrical conductivity, and it is not easy to oxidize in the air. Thus, the nano silver-coated metal particles are preferably adopted in the present application to prevent the oxidation of the nano metal particles 1. In addition, the nano silver-coated metal particles have better electrical conductivity and high chemical stability, so the use of nano silver-coated metal particles can obtain better effect of the line repairing, without considering the oxidation problem and having easier operations.

When the laser 3 irradiates the nano metal particles 1 in step B), the laser 3 is a continuous laser or a pulsed laser with a wavelength of 0.01 μm-20 μm. A pulse width of the pulsed laser is in the order of picoseconds, femtoseconds or nanoseconds. The laser 3 is a single pulse-type laser or a multiple pulse-type laser.

When there is only one defect 21 on the circuit board 2, the single pulse-type laser can be used to irradiate the nano metal particles 1 in the defect 21 to complete the line repairing. When there are multiple defects 21 on the circuit board 2, the multiple pulse-type laser can be used to irradiate the nano metal particles 1 at the multiple defect locations 21 at the same time, so as to perform the line repairing at the multiple defect locations 21 at the same time, thereby improving the efficiency of the line repairing.

In step B), when the laser 3 is used to irradiate the liquid or paste prepared by adding the nano metal particles 1 into the solvent, the liquid or paste can be directly irradiated by the laser, or the liquid or paste on the defect is preheated and dried using a laser with first energy lower than preset energy, so as to reduce an organic content in the liquid or paste, and then, the liquid or paste is irradiated by a laser with second energy higher than the preset energy, so that the liquid or paste in the defect is metallurgically bonded to the original line.

Embodiment 1

The nano metal particles 1 coated with polyvinylpyrrolidone having a particle size of 50 nm are added into ethylene glycol to form a metal paste with a solid content of 80% by weight. The metal paste is dropwise added to the defect 21 of a redistribution layer by a spray nozzle. A total area of the redistribution layer is 8 mm×8 mm. The laser 3 with an appropriate wavelength and energy irradiates the nano metal particles 1 in the defect 21 to melt the nano metal particles at a lower temperature to fill the defective line. After the laser 3 is removed, the defect 21 and the original line of the circuit board 2 form a conductive path, whereby the lines of the circuit board 2 form a complete conductive path. Then the surface of the circuit board 2 is cleaned to complete the line repairing.

Embodiment 2

The nano metal particles 1 coated with imidazole having a particle size of 100 nm are added into ethylene glycol to form a metal paste with a solid content of 85% by weight. The metal paste is dropwise added to the defect 21 of a printed-circuit board by a spray nozzle. The laser 3 with an appropriate wavelength and energy irradiates the nano metal particles 1 in the defect 21 to melt the nano metal particles at a lower temperature to fill the defective line. After the laser 3 is removed, the defect 21 and the original line of the circuit board 2 form a conductive path, whereby the lines of the circuit board 2 form a complete conductive path. Then the surface of the circuit board 2 is cleaned to complete the line repairing.

The technical principle of the present application is described above in conjunction with the embodiments, which is only for the description purpose and is not intended to limit the scope of the present invention. Other embodiments can be made by those skilled in the art based on the disclosure without sparing any creative effort, and these equivalent variations or replacements shall fall within the scope defined by the claims of the present application.

What is claimed is:

1. A method for repairing a fine line, comprising:
   1) filling nano metal particles in a defect of a circuit board, wherein a liquid or a paste prepared by adding the nano metal particles into a solvent is sent to the defect by a spray nozzle or a drip nozzle;
   2) irradiating, by a laser, or heating, the nano metal particles in the defect, such that the nano metal particles in the defect are metallurgically bonded to an original line of the circuit board; and
   3) cleaning a surface of the circuit board to remove residual nano metal particles on parts of the circuit board where metallurgical bonding is not performed, thereby completing line repairing of the circuit board;
   wherein in step 1), after the nano metal particles are filled in the defect, a light-transmitting plate covers the defect, and a downward force is applied to the light-transmitting plate; and
   in step 2), during the irradiation by the laser, the laser is focused on the nano metal particles under the light-transmitting plate,
   in step 2), when the laser irradiates the liquid or paste prepared by adding the nano metal particles into the solvent, the liquid or paste is irradiated by the laser; or the liquid or paste on the defect is preheated and dried using a laser with first energy lower than preset energy, so as to reduce an organic content in the liquid or paste; and then the liquid or paste is irradiated by a laser with second energy higher than the preset energy, so that the liquid or paste in the defect is metallurgically bonded to the original line.

2. The method of claim 1, wherein in step 3), the step of cleaning the surface of the circuit board comprises:
   cleaning the surface of the circuit board using an organic solution; heating the circuit board according to the degree of removal of the residual nano metal particles; or
   cleaning the surface of the circuit board using an oxidizing solution to oxidize the residual nano metal particles on the surface of the circuit board; and cleaning the surface of the circuit board using an acid solution to remove the residual nano metal particles on the surface of the circuit board.

3. The method of claim 1, wherein the solvent comprises one or more of ethylene glycol, ethanol and terpineol; the solvent is 0-80% by weight of the paste; and during the preparation of the liquid or the paste, an organic reducing agent comprising aldehydes or alcohols and a soldering flux comprising rosin are added.

4. The method of claim 1, wherein in step 2), an arc-shaped protrusion is provided at an upper surface of the light-transmitting plate; when the nano metal particles are irradiated using the laser, the laser is focused on the nano metal particles under the light-transmitting plate through the arc-shaped protrusion.

5. The method of claim 1, wherein a surface of the nano metal particles is coated with one or more of polyvinylpyrrolidone, imidazole, 2-phenylimidazole and benzimidazole.

6. The method of claim 5, wherein the nano metal particles are a mixture of particles with the same particle size ranging from 1 nm to 5000 nm; and the nano metal particles have the same shape, being spherical, linear, flake-shaped or irregularly-shaped; or
   the nano metal particles are a mixture of particles having different shapes and different particle sizes.

7. The method of claim 1, wherein the nano metal particles are a mixture of particles with the same particle size; or
- the nano metal particles are a mixture of nano-sized particles with different particle sizes; or
- the nano metal particles are a mixture of nano-sized particles and micron-sized particles.

8. The method of claim 1, wherein the nano metal particles comprise one or more of nano copper particles, nano silver particles, nano silver-coated copper particles, nano silver-coated copper flakes and nano copper-silver alloy particles.

9. The method of claim 1, wherein when the nano metal particles are irradiated by the laser in step 2), the laser is a continuous laser or a pulsed laser with a wavelength of 0.01 μm-20 μm; a pulse width of the pulsed laser is in the order of picoseconds, femtoseconds or nanoseconds; and the laser is a single pulse-type laser or a multiple pulse-type laser.

\* \* \* \* \*